United States Patent
Wagner et al.

(10) Patent No.: US 7,473,958 B2
(45) Date of Patent: Jan. 6, 2009

(54) ELECTRONIC MEMORY COMPONENT WITH PROTECTION AGAINST LIGHT ATTACK

(75) Inventors: Mathias Wagner, Alvesen-Rosengarten (DE); Joachim Garbe, Schenefeld (DE)

(73) Assignee: NXP B.V., Eindhoven (NL)

( * ) Notice: Subject to any disclaimer, the term of this patent is extended or adjusted under 35 U.S.C. 154(b) by 413 days.

(21) Appl. No.: 10/535,368

(22) PCT Filed: Nov. 13, 2003

(86) PCT No.: PCT/IB03/05156

§ 371 (c)(1),
(2), (4) Date: May 18, 2005

(87) PCT Pub. No.: WO2004/047172

PCT Pub. Date: Jun. 3, 2004

(65) Prior Publication Data

US 2006/0081912 A1  Apr. 20, 2006

(30) Foreign Application Priority Data

Nov. 21, 2002  (DE) ................................ 102 54 325

(51) Int. Cl.
*H01L 27/115* (2006.01)
(52) U.S. Cl. .............................. 257/316; 257/E27.103; 257/314
(58) Field of Classification Search ................ 257/316, 257/E21.68, 315, 323, 314, 298, E27.103, 257/E29.306
See application file for complete search history.

(56) References Cited

U.S. PATENT DOCUMENTS

| | | | |
|---|---|---|---|
| 5,341,342 A * | 8/1994 | Brahmbhatt | 365/185.3 |
| 5,867,425 A * | 2/1999 | Wong | 365/185.08 |
| 6,025,625 A * | 2/2000 | Chi | 257/315 |
| 6,026,017 A * | 2/2000 | Wong et al. | 365/185.05 |
| 6,330,190 B1 * | 12/2001 | Wang et al. | 365/185.28 |
| 6,512,700 B1 * | 1/2003 | McPartland et al. | 365/185.28 |
| 2002/0130248 A1 * | 9/2002 | Bretschneider et al. | 250/214 R |
| 2005/0036383 A1 * | 2/2005 | Gamperl et al. | 365/222 |

* cited by examiner

*Primary Examiner*—Theresa T Doan
*Assistant Examiner*—Sarah K Salerno

(57) ABSTRACT

In order to further develop an electronic memory component (100 or 100'), comprising at least one memory cell matrix (10) which is embedded in and/or let into at least one doped receiving substrate (20), in such a way that a light incidence taking the form of a so-called light attack is detected directly or sensed immediately without dead times (=contribution to chip development), it is proposed,—that the receiving substrate (20) be covered and/or surrounded at least partially and/or on at least one of its surfaces remote from the memory cell matrix (10) by at least one top/protective substrate (30) oppositely doped to the receiving substrate (20) and—that at least one of the substrates (20 or 30), for example the receiving substrate (20) and/or in particular the top/protective substrate (30), be in contact (12*a* or 12*b*) or connection (32) with at least one circuit arrangement (24 or 34 respectively) for the detection of voltages or currents caused by charge carriers generated upon light incidence.

18 Claims, 2 Drawing Sheets

ELECTRONIC MEMORY COMPONENT WITH PROTECTION AGAINST LIGHT ATTACK

Figure 1:
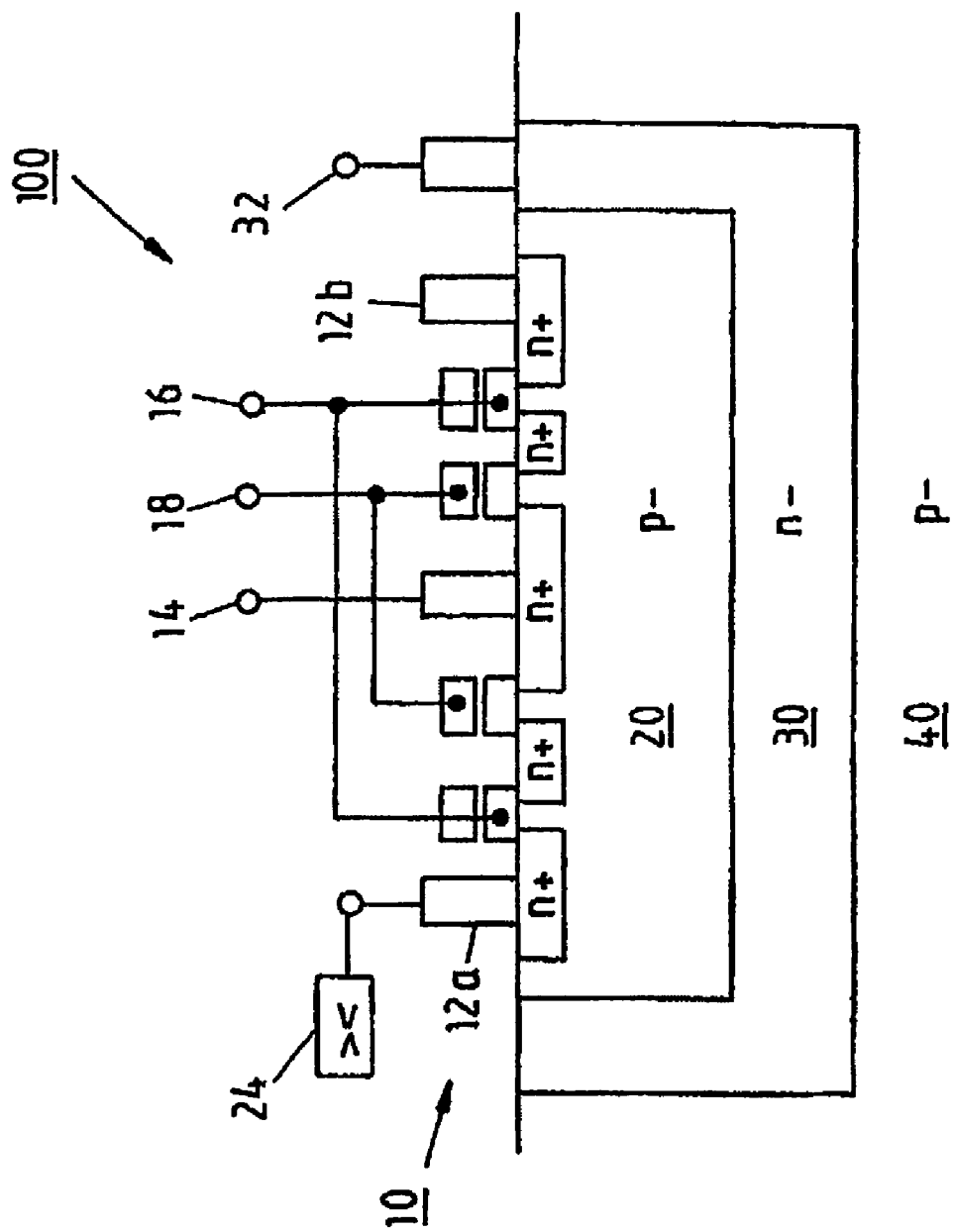

The present invention relates in general to the technical field of electronic components, in particular microelectronic components.

In particular, the present invention relates to an electronic memory component, comprising at least one memory cell matrix, which is embedded in and/or let into at least one doped receiving substrate.

Electronic memory components, such as for example E[rasable] P[rogrammable] R[ead] O[nly] M[emory], E[lectrical] E[rasable] P[rogrammable] R[ead] O[nly] M[emory] or Flash memory, allow reading and/or writing of digital data in the form of "1" and "0", which are frequently referred to as written or erased states (bits). External influences, such as for example irradiation with strong light sources (so-called light attacks), may result in incorrect reading of these data.

This incorrect reading of the data may be countered by, for example, using an error correction code, with which the information is stored redundantly on the physical medium and, upon reading-in of the data, an algorithm examines precisely these data for errors.

Algorithms are typically used which may detect and/or correct in a memory block of for example eight logic bits (to which more than eight physical bits then correspond) one or more incorrect bits (known examples are Hamming codes).

For reasons of efficiency and cost, in the case of the error correction code, the algorithm used for error detection will never be able to detect all the errors possible in principle, but will always be restricted to detection and possible correction of relatively few bits per memory block. In security-critical applications this is not always sufficient, especially not if certain characteristic error patterns occur very much more frequently in the bits than other error patterns or can even be deliberately produced by external manipulation.

Thus, for example, when coding the counter for the money entered on a payment card, it is essential always to ensure that the physically stable state, i.e. the state into which the data storage medium could be changed by physical processes after a number of years, corresponds to an empty account state, so that the payment card cannot be charged up with more money without authorization.

Other possible ways of resisting light attacks are, for example, duplicated read access to the data (so-called "read-verify mode"), in which the results are compared with one another, or reading of the data with disabled wordlines before or after actual read access. Disabling the wordlines has the effect that in error-free operation one and the same pattern is always read (so-called "read-known-answer mode"); deviations therefrom then indicate an attack.

However, duplicated read accesses like the "read-verify mode" or the "read-known-answer mode" can only ever detect attacks which occur precisely at the moment of the verifying read access. Outside this time window, such sensors are blind, since the error as a rule occurs only transiently during reading; moreover, with these methods effective read access is extended.

Finally, dedicated light sensors also exist which may be distributed on the memory chip. Although such dedicated light sensors may detect light attacks at any desired time, they are small in comparison to the memory chip and cannot therefore offer complete surface coverage. If, on the other hand, the number of these sensors is increased, the space requirement for the memory chip also increases, which has a disadvantageous effect on the production costs thereof.

All above-mentioned potential security risks arise, for example, in the field of smart cards.

Taking as basis the above-described disadvantages and shortcomings (=expensive, complicated error correction mechanisms; duplicated read accesses; locally limited light sensors), it is an object of the present invention further to develop an electronic memory component of the above-mentioned type in such a way that a light incidence occurring in the form of a so-called light-attack is detected directly or sensed immediately without dead times (=contribution to chip development).

This object is achieved with an electronic memory component having the features indicated in claim 1. Advantageous embodiments and expedient further developments of the present invention are identified in the dependent claims.

According to the teaching of the present invention, a completely novel approach to a microelectronic memory chip is therefore disclosed, with an integral, large-area light sensor without dead times.

The memory cells in semiconductor-based electronic memory chips are appropriately arranged in regular matrices. In the case of non-volatile memories in particular, a high voltage is required for programming or erasure. To keep the maximum voltage to be handled as low as possible, the programming voltage is preferably divided into a positive portion and a negative portion. This means that the substrate in which the memory cells are formed may also be connected to a negative potential.

To make this possible, said substrate, which may for instance be p-doped and/or known for example as a H[igh-Voltage]P-W[ell], is enclosed at the bottom and/or the sides, according to an inventive further development of the present microelectronic memory chip, by an oppositely doped B[uried]N-W[ell], which may for example be n-doped. During a light attack, charge carriers are then generated in the semiconductor, which become apparent as additional currents inter alia in the contacts to these wells.

These currents may be measured by means of at least one circuit arrangement, preferably in the form of a comparator circuit, in order for example to deny access to the memory chip and/or to send a suitable alarm signal to the controlling C[entral]P[rocessing]U[nit] if certain limit or threshold values of the (photo) voltage or photocurrent are exceeded. The aim and purpose of the circuit arrangement, which is in contact or connection according to the invention with at least one of the substrates,

- for example with the H[ighVoltage]P-W[ell] taking the form of a receiving substrate and/or
- preferably with the B[uried]N-W[ell] taking the form of a top/protective substrate, is thus to detect the voltages or currents caused by charge carriers generated upon light incidence.

In contrast to other circuit elements in the matrix, where currents may flow on the basis of normal read processes, the potential at the buried n-well is static in read mode. Therefore, with the present invention, even small, light-induced currents may be constantly and unambiguously detected in a particularly preferred manner.

A light sensor which measures induced currents in an appropriately large-area well of the memory cell matrix has the advantage of not only covering the greater part of the memory chip but also at the same time of being constantly active, i.e. it does not exhibit any dead times in which a light attack could proceed unnoticed. Moreover, the space requirement for the memory chip increases only insignificantly, since the wells are already present anyway and space has merely to be kept for example for accommodating a current comparator and the associated logic.

The present invention finally relates to the use of an electronic memory component of the above-described type for in particular continuous detection and/or for in particular permanent sensing of the incidence of light, in particular in the form of at least one light attack, for example on at least one smart card.

Figure 2:
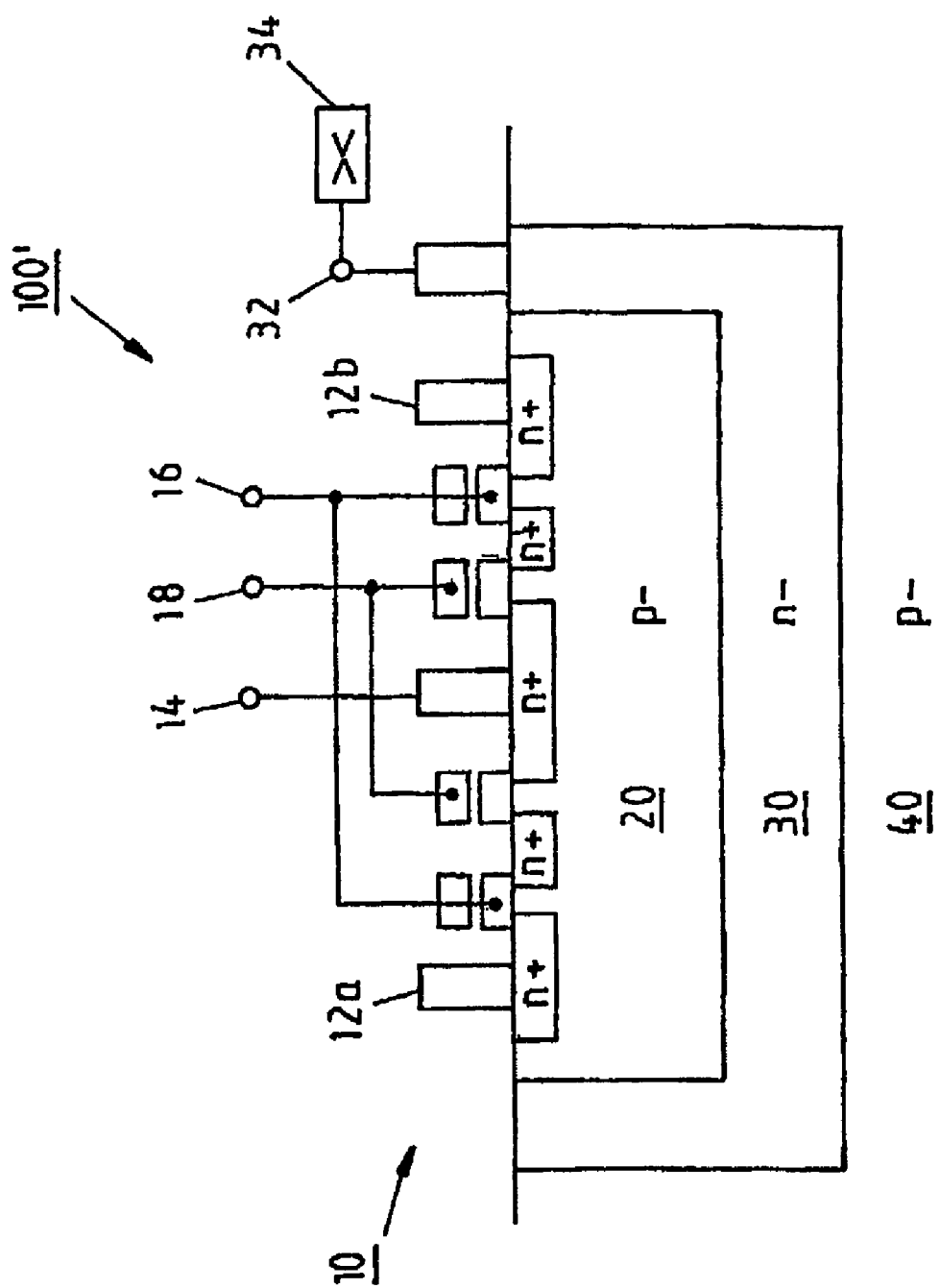

As already discussed above, there are various possible ways of advantageously embodying and developing the teaching of the present invention. Reference is made, in this regard, to the claims subordinate to claim 1, and the invention will be further described with reference to examples of embodiment shown in the drawings to which, however, the invention is not restricted. In the Figures:

FIG. 1 is a schematic, cross-sectional representation, not to scale for reasons of clarity and visibility of the individual versions, elements or features, of a first example of embodiment of a microelectronic memory component according to the present invention; and FIG. 2 is a schematic, cross-sectional representation, not to scale for reasons of clarity and visibility of the individual versions, elements or features, of a second example of embodiment of a microelectronic memory component according to the present invention.

Identical or similar versions, elements or features are provided with identical reference numerals in FIGS. 1 and 2.

The semiconductor-based microelectronic memory chip 100 in the first example of embodiment, illustrated in FIG. 1, and the semiconductor-based microelectronic memory chip 100' in the second example of embodiment, illustrated in FIG. 2, are in each case flash memory chips with a (n matrix) memory cell 10, according to the present invention, embedded in, i.e. let into a p-doped receiving substrate 20 in the form of a H[ighVoltage]P-W[ell].

Two external sources 12a, 12b, a central bitline 14, a wordline 16 arranged between bitline 14 and first source 12a or second source 12b and a control gate 18 located between bitline 14 and wordline are associated with this (n matrix) memory cell 10.

In the case of the memory chip 100 (c.f. FIG. 1) or 100' (c.f. FIG. 2) shown, a high voltage is required for programming or erasure. To keep the maximum voltage to be handled lowest possible in this context, the programming voltage is divided into a positive portion and a negative portion. This means that the p-doped receiving substrate 20, in which the memory cells 10 are formed, may also be connected to a negative potential.

To make this possible, the p-doped receiving substrate 20, which is shown in both FIG. 1 and FIG. 2 as a H[ighVoltage]P-W[ell], is covered and thus enclosed on its faces remote from the memory cells 10, i.e. at the bottom and the sides, by an oppositely doped B[uried]N-W[ell], (=n-doped top/protective substrate 30, which is buried in a p-doped carrier substrate 40 (wafer) located therebelow and protects the (n matrix) memory cell 10 from irradiation by strong light sources, i.e. from so-called light attacks). During a light attack, charge carriers are generated in the semiconductor, which become apparent as additional currents inter alia in the contacts to these two wells, i.e. in the contacts 12a, 12b to the receiving substrate 20 and in the connection 32 to the top/protective substrate 30.

In the first example of embodiment of the microelectronic memory chip 100 according to FIG. 1, these currents are measured without dead times by means of a comparator circuit 24 connected with the receiving substrate 20 via the electrical contact 12a taking the form of an external source, in order to deny access to the memory chip 100 and/or to send a suitable alarm signal to the controlling C[entral]P[rocessing]U[nit] if certain threshold values are exceeded (for example a reference current set with regard to the photocurrent arising). Alternatively or in addition to the electrical contact 12a, connection of the comparator circuit 24 to the receiving substrate 20 is also possible via the electrical contact 12b taking the form of an external source.

In the second example of embodiment of the microelectronic memory chip 100' according to FIG. 2, the additional currents generated as a result of a light attack are measured without dead times by means of a comparator circuit 34 connected with the top/protective substrate 30 via an electrical contact 32, in order to deny access to the memory chip 100' and/or to send a suitable alarm signal to a controlling C[entral]P[rocessing]U[nit] if certain threshold values are exceeded (for example a reference current set with regard to the photocurrent arising).

In contrast to other circuit elements in the matrix 10, where currents may flow on the basis of normal read processes, the potential at the buried n-doped B[uried]N-W[ell] 30 is static in read mode. The second example of embodiment according to FIG. 2 therefore appears preferable to the first example of embodiment according to FIG. 1 because, especially with the second example of embodiment according to FIG. 2, even small, light-induced currents may be detected constantly and unambiguously at any desired time.

The present integral light sensor, which measures induced currents in the large-area p-doped H[ighVoltage]P-W[ell] 20 (=first example of embodiment according to FIG. 1) of the memory cell matrix 10 or in the large-area n-doped B[uried]N-W[ell] 30 (=second example of embodiment according to FIG. 2) of the memory cell matrix 10 and immediately "starts" in particular in the event of intense light action, i.e. in the event of an intense light attack, has the advantage not only of covering the majority of the memory chip 100 or 100' but also at the same time of being constantly active, i.e. it does not exhibit any dead times in which a light attack could proceed unnoticed.

Moreover, the space requirement for the memory chip 100 or 100' increases only insignificantly, since the wells 20, 30 are already present anyway and space has merely to be kept for example for accommodating the current comparator 24 (=first example of embodiment according to FIG. 1) or 34 (=second example of embodiment according to FIG. 2) and the associated logic.

LIST OF REFERENCE NUMERALS

100 Electronic memory component, in particular microelectronic memory component (first example of embodiment)
100' Electronic memory component, in particular microelectronic memory component (second example of embodiment)
10 Memory cell matrix
12a First source, in particular in the form of a contact between receiving substrate 20 and circuit arrangement 24
12b Second source
14 Bitline
16 Wordline
18 Control gate
20 Receiving substrate, in particular H[ighVoltage]P-W[ell]
24 Circuit arrangement, in particular comparator circuit, associated with the receiving substrate 20
30 Top/protective substrate, in particular B[uried]N-W[ell]

32 Connection, in particular between top/protective substrate 30 and circuit arrangement 34

34 Circuit arrangement, in particular comparator circuit, associated with the top/protective substrate 30

40 Carrier substrate

The invention claimed is:

1. An electronic memory component, comprising:
   a receiving substrate, wherein the receiving substrate is doped;
   a memory cell matrix embedded in the receiving substrate;
   a top/protective substrate to at least partially surround the receiving substrate on at least one side of the receiving substrate remote from the memory cell matrix, wherein the top/protective substrate is doped opposite to the receiving substrate; and
   a circuit arrangement in contact with at least one substrate of the receiving substrate and the top/protective substrate for detection of a voltage or a current from the at least one substrate of the receiving substrate and the top/protective substrate, other than from a dedicated light sensor circuit component, in response to generation of charge carriers in the at least one substrate upon light incidence on the electronic memory component.

2. The electronic memory component of claim 1, wherein the circuit arrangement comprises a comparator circuit.

3. The electronic memory component of claim 2, wherein the comparator circuit is connected with the receiving substrate, via an electrical contact, to detect the voltage or the current in the receiving substrate.

4. The electronic memory component of claim 2, wherein the comparator circuit is connected with the top/protective substrate, via an electrical contact, to detect the voltage or the current in the top/protective substrate.

5. The electronic memory component of claim 1, wherein the electronic memory component is configured to deny access to the memory component in response to detection by the circuit arrangement of the voltage in excess of a limit voltage or the current in excess of a limit current.

6. The electronic memory component of claim 1, wherein the electronic memory component is configured to emit an alarm to a controlling central processing unit (CPU) in response to detection by the circuit arrangement of the voltage in excess of a limit voltage or the current in excess of a limit current.

7. The electronic memory component of claim 1, wherein the top/protective substrate comprises a well to surround the receiving substrate.

8. The electronic memory component of claim 1, further comprising a carrier substrate, wherein the top/protective substrate is associated with the carrier substrate.

9. The electronic memory component of claim 8, wherein the top/protective substrate is buried in the carrier substrate.

10. The electronic memory component of claim 8, wherein:
    the receiving substrate comprises a p-doped substrate;
    the top/protective substrate comprises an n-doped substrate; and
    the carrier substrate comprises another p-doped substrate.

11. The electronic memory component of claim 1, further comprising:
    an external source associated with the memory cell matrix, wherein the external source comprises a contact;
    a bitline associated with the memory cell matrix;
    a wordline associated with the memory cell matrix; and
    a control gate associated with the memory cell matrix.

12. The electronic memory component of claim 1, wherein the electronic memory component comprises an erasable programmable read only memory (EPROM), an electrical erasable programmable read only memory (EEPROM), or a Flash memory.

13. The electronic memory component of claim 1, wherein the electronic memory component is configured to continuously detect for light incidence in the form of a light attack.

14. The electronic memory component of claim 1, wherein the electronic memory component is on a smart card.

15. The electronic memory component of claim 3, wherein the receiving substrate comprises an integral, large-area light sensor to generate the charge carriers in the receiving substrate, wherein the receiving substrate is configured to generate the charge carriers in response to the light incidence on any part of the receiving substrate.

16. The electronic memory component of claim 3, wherein the receiving substrate covers a majority of a surface area of the electronic memory component, wherein the receiving substrate is configured to generate the charge carriers in response to the light incidence on any part of the receiving substrate.

17. The electronic memory component of claim 4, wherein the top/protective substrate comprises an integral, large-area light sensor to generate the charge carriers in the top/protective substrate, wherein the top/protective substrate is configured to generate the charge carriers in response to the light incidence on any part of the top/protective substrate.

18. The electronic memory component of claim 4, wherein the top/protective substrate covers a majority of an area of the electronic memory component, wherein the top/protective substrate is configured to generate the charge carriers in response to the light incidence on any part of the top/protective substrate.

* * * * *